(12) United States Patent
Yoshikawa

(10) Patent No.: US 6,466,076 B2
(45) Date of Patent: Oct. 15, 2002

(54) VARIABLE DELAY CIRCUIT HAVING A RAMP VOLTAGE GENERATING UNIT

(75) Inventor: Kiyoshi Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/853,788

(22) Filed: May 14, 2001

(65) Prior Publication Data
US 2001/0040473 A1 Nov. 15, 2001

(30) Foreign Application Priority Data

May 15, 2000 (JP) ........................................ 2000-141265

(51) Int. Cl.[7] .............................................. H03K 17/16
(52) U.S. Cl. ........................ 327/382; 327/136; 327/281
(58) Field of Search ................................ 327/276–278, 327/280–281, 287–288, 262, 362, 382, 126, 130–134, 136, 127

(56) References Cited

U.S. PATENT DOCUMENTS

| | | | | |
|---|---|---|---|---|
| 5,502,410 A | * | 3/1996 | Dunn et al. ................... | 327/103 |
| 5,617,051 A | * | 4/1997 | Bingham ...................... | 326/27 |
| 5,929,671 A | * | 7/1999 | Best ............................. | 327/131 |
| 5,973,522 A | * | 10/1999 | Coy et al. ..................... | 327/131 |
| 6,169,433 B1 | * | 1/2001 | Farrenkopf .................. | 327/131 |
| 6,316,972 B1 | * | 11/2001 | Koffmane et al. ........... | 327/132 |

FOREIGN PATENT DOCUMENTS

JP          8-181584          7/1996

* cited by examiner

Primary Examiner—Kenneth B. Wells
Assistant Examiner—Cassandra Cox
(74) Attorney, Agent, or Firm—McGinn & Gibb, PLLC

(57) ABSTRACT

A variable delay circuit includes a ramp voltage generating unit having a storage capacitor, a charging transistor for charging the capacitor and a constant-current source for discharging the capacitor, and a comparator for comparing the output of the ramp voltage generating circuit against a voltage setting to output a delayed signal. The electric charge flowing out from the output node of the ramp voltage generating unit through the charging transistor during generating the ramp voltage is compensated by a compensating capacitor to output a linear ramp voltage.

16 Claims, 12 Drawing Sheets

US 6,466,076 B2

VARIABLE DELAY CIRCUIT HAVING A RAMP VOLTAGE GENERATING UNIT

BACKGROUND OF THE INVENTION (a) Field of the Invention

The present invention relates to a variable delay circuit having a ramp voltage generating unit, and more particularly to a high-performance variable delay circuit which generates delay times following the settings with excellent linearity.

(b) Description of the Related Art

In recent years, capability of higher time resolution measurement has been required of LSI testers along with the higher speed operation of LSIs to be measured. The minimum time resolution (1 LSB) is on its way to falling below 10 pico-second (ps). Moreover, LSI testers for measuring LSI absolute performance must have a sufficiently high accuracy guaranteed. Typically, the degree of accuracy requirements for the time resolution is 1 LSB or smaller. The variable delay time used for the time resolution measurement is generated by a known variable delay circuit having a ramp voltage generating unit. For the sake of sufficiently high accuracy, the linearity of the delay time with respect to settings is of importance. Since the linearity of the delay time depends on the linearity of the ramp voltage waveform, it is important to generate the ramp voltage with superior linearity. As used herein, the term "ramp voltage" refers to a signal voltage having a waveform wherein the amplitude varies or changes linearly in proportion to time.

FIG. 1 is a circuit diagram of a variable delay circuit described in Japanese Patent Laid-Open Publication No. Hei 8-181584. Nodes N11 and N12 receive differential signals which are complementary to each other. It is assumed here that the logic on the node N11 is the positive logic. A node N19 receives an arbitrary voltage setting which falls within the range of the amplitude on a ramp voltage generating node 16. When H-level and L-level are input to the node N11 and the node N12, respectively, an NPN transistor Q11 turns ON and an NPN transistor Q12 turns OFF. As a result, a node N13 turns to H-level. Thus, an NPN transistor Q13 turns ON to charge a storage capacitor C11, thereby raising the potential of the node N16 to H-level. The storage capacitor C11 is charged steeply in a very short time after the potential change of the node N13 due to the large driveability of the NPN transistor Q13.

Feed of L-level to the node N11 and H-level to the node N12 turns the NPN transistor Q11 OFF and the NPN transistor Q12 ON. Thus, the node N13 turns to L-level. Here, the NPN transistor Q13 turns OFF since the node N16 is held at the H-level by the charge stored in the capacitor. The charge stored in the storage capacitor C11 is gradually discharged at a constant rate through a constant-current source 15. Due to the constant rate of the discharge, the potential of the node N16 traces a ramp voltage waveform which declines linearly in proportion to time. When the ramp voltage falls below the potential input to the node N19, a comparator 16 turns its output potential on a node N17 from H-level to L-level. The voltage setting input to the node N19 can be changed to modify the time instant at which the potential of the ramp voltage falls below the potential input to the node N19. The voltage setting for the node N19 achieves variation of the delay time.

FIG. 2 shows potential changes on some of the nodes in the circuit diagram of FIG. 1. For convenience of description, the delay variation is shown in seven levels. It is to be noted however that the known high-performance variable delay circuits usually have a greater number of variation levels.

The node N19 receives any one of arbitrary voltage settings V1 to V7. The potential of the node N17 falls from H-level to L-level at any of the time instants t1 to t7 at which the potential of the node N16 falls below the potential of the node N19. The time interval between the time t0 at which the node N11 falls and any one of the times t1 to t7 at which the node N17 falls based on the voltage settings V1 to V7 is the delay time generated by the variable delay circuit. The time interval between the time t1 and the time t7 is the span of the variable delay time.

In the variable delay circuit described in the above publication, as described above, the charge stored in the storage capacitor C11 is discharged through the constant-current source 15. In the discharge, the waveform of the node N13 does not trace an ideal rectangular waveform and falls from H-level to L-level with a significant deformation (deterioration). Thus, during the potential fall of the node 16, the capacitor-charging transistor Q13 is subjected to a voltage that varies with time, across its base and emitter. It is to be noted that there is a parasitic capacitance Cje11 between the base and emitter of the capacitor-charging transistor Q13, which means that the voltage across this parasitic capacitance Cje11 varies also. The variation of the voltage across the parasitic capacitance Cje11 causes storage of charge in this parasitic capacitance. This impedes the charge in the storage capacitor C11 from decreasing at a constant rate, thereby degrading the linearity of the ramp voltage. The waveform shown in FIG. 2 has a significant deterioration in the linearity thereof. In this connection, the straight, broken line in FIG. 2 shows a ramp voltage without any linearity deterioration that results from the storage of charge in the parasitic capacitance Cje11 of the capacitor-charging transistor Q13.

FIGS. 3A and 3B are a graph showing the characteristic of the delay time generated by the variable delay circuit of FIG. 1 and a graph showing the amount of deterioration of the delay time from the straight line, respectively. The delay time loses its linearity while the potential of the node N13 in FIG. 1 changes from H-level to L-level.

FIG. 4 shows how the ramp voltage in the variable delay circuit shown in FIG. 1 deteriorates in linearity due to the parasitic capacitance, illustrating (a) potential of the node N13, (b) base-to-emitter voltage of the transistor Q13, (c) charge in the parasitic capacitor Cje11 and (d) potential of the node N16. The diagram specifically shows the time interval from the time instant t0 when the waveform of the node N13 starts its fall to the time instant tm when the waveform of the node N13 completes the change to L-level, during which the charge flows on the node 16 into the parasitic capacitance Cje11 of the capacitor-charging transistor Q13 to cause a deterioration in the linearity of the ramp voltage. The voltage across the parasitic capacitance Cje11 continues to change until the ramp voltage reaches L-level. A linear change of the voltage, however, results in a linear outflow of the charge in the parasitic capacitor Cjell through the constant-current source 15 after the time instant tm, thereby causing no significant deterioration in this period in the linearity of the ramp voltage.

Among the possible prevention measures against the linearity deterioration, a method may be adopted by forming the storage capacitor C11 to have a larger capacitance and increasing the current flowing through the constant-current source 15 so that the influence of the charge flow into the parasitic capacitance Cje11 of the capacitor-charging transistor Q13 decreases in the proportion to the whole current. If the measure by this method is adopted, however, the upsizing of the capacitor causes an increase in circuit scale, and the rise of the current yields an increase in power dissipation. Higher integration and multi-function of LSIs in the trend of recent years increase the numbers of pins on the LSIs to be measured and advance the measurement coverage. This trend also necessitates higher integration and lower power dissipation even in the tester LSIs. In light of these requirements, the increases in circuit scale and power dissipation are unacceptable. Furthermore, this measure provides merely a reduction of the proportion of deterioration to the whole, and the linearity deterioration still occurs, without providing any essential solution.

SUMMARY OF THE INVENTION

It is an object of the present invention to provide an essential solution to the problem of the conventional art described above, and to provide a high-performance variable delay circuit having a higher linearity.

The present invention provides, in a first aspect thereof, a variable delay circuit including a signal input unit for receiving an input signal to output a first signal through a first node, a ramp voltage generating unit for generating a ramp voltage on a ramp voltage output node, the ramp voltage generating circuit including a storage capacitor for storing electric charge on the ramp voltage output node, a charging transistor for responding to the first signal to charge the ramp voltage output node, and a constant-current source for discharging the ramp voltage output node at a constant rate, a comparator for comparing the ramp voltage against a voltage setting to output a delayed signal which is delayed from the input signal by a delay time corresponding to the voltage setting, and a compensating unit for compensating electric charge flowing from the ramp voltage output node into a parasitic capacitance of the charging transistor.

The present invention provides, in a second aspect thereof, a variable delay circuit comprising a signal input unit for receiving an input signal to output a first signal through a first node, a ramp voltage generating unit for generating a ramp voltage on a ramp voltage output node, the ramp voltage generating circuit including a storage capacitor for storing electric charge on the ramp voltage output node, a discharging transistor for responding to the first signal to discharge the ramp voltage output node, and a constant-current source for charging the ramp voltage output node at a constant rate, a comparator for comparing the ramp voltage against a voltage setting to output a delayed signal which is delayed from the input signal by a delay time corresponding to the voltage setting, and a compensating unit for compensating electric charge flowing from the ramp voltage output node into a parasitic capacitance of the discharging transistor.

In accordance with the variable delay circuit of the present invention, the compensation unit compensates the electric charge flowing into the parasitic capacitance of the charging or discharging transistor to store electric charge in the parasitic transistor, thereby maintaining a high linearity of the ramp voltage waveform, whereby the delay times output from the variable delay circuit follow the voltage settings with an excellent linearity.

DETAILED DESCRIPTION OF THE PREFERRED EMBODIMENTS

Figure 1:
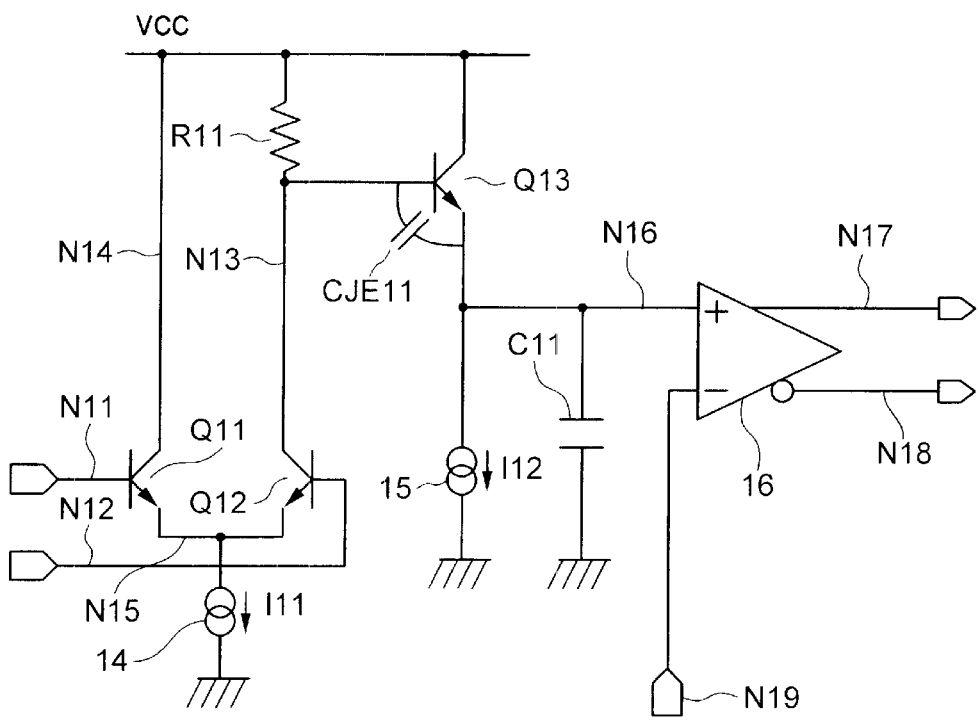
FIG. 1 is a circuit diagram of a conventional variable delay circuit.
Figure 2:
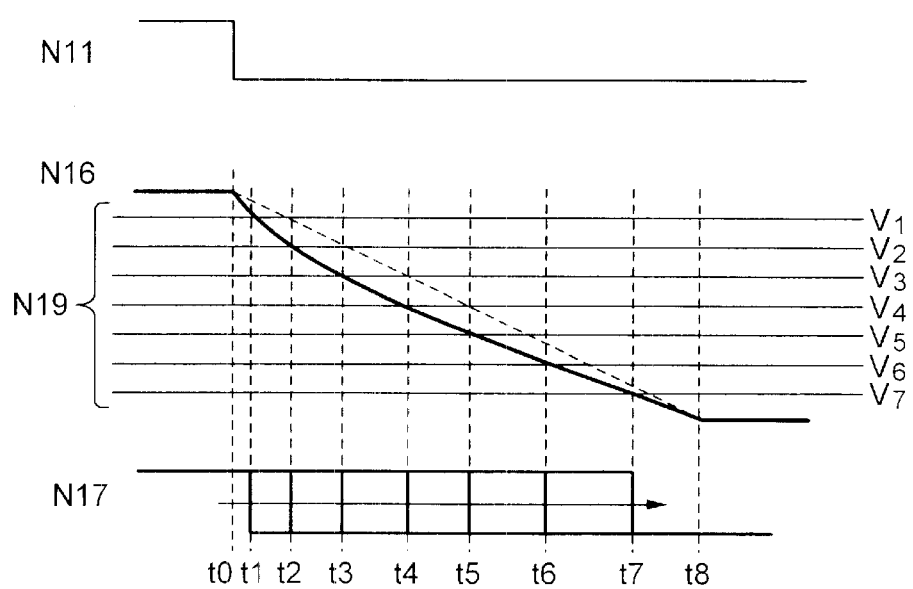
FIG. 2 is a timing chart of the potentials of nodes in the variable delay circuit of FIG. 1.
Figure 3A:
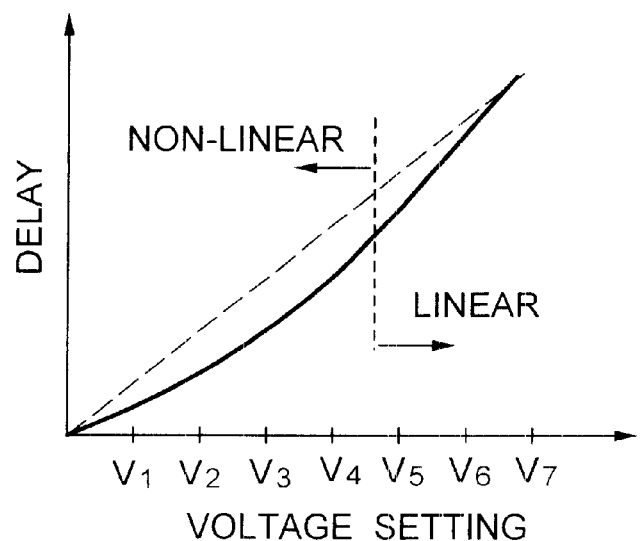
FIGS. 3A and 3B are diagrams showing the characteristic of the delay time and the non-linearity of the delay time, respectively, of the variable delay circuit of FIG. 1.
Figure 3B:
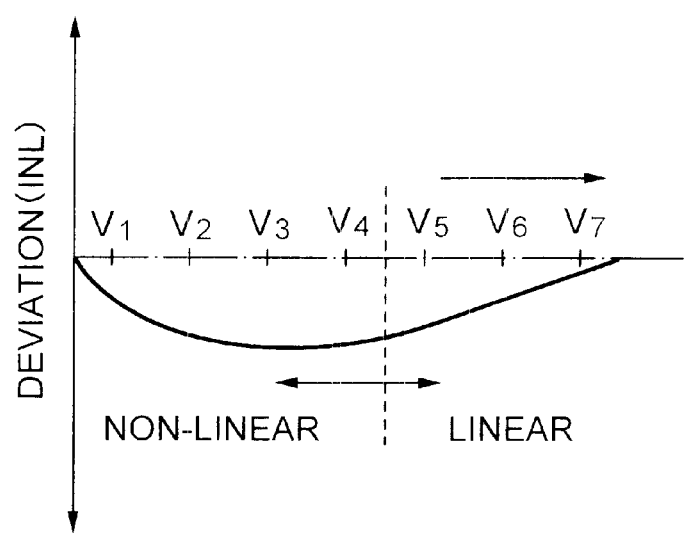
Figure 4:
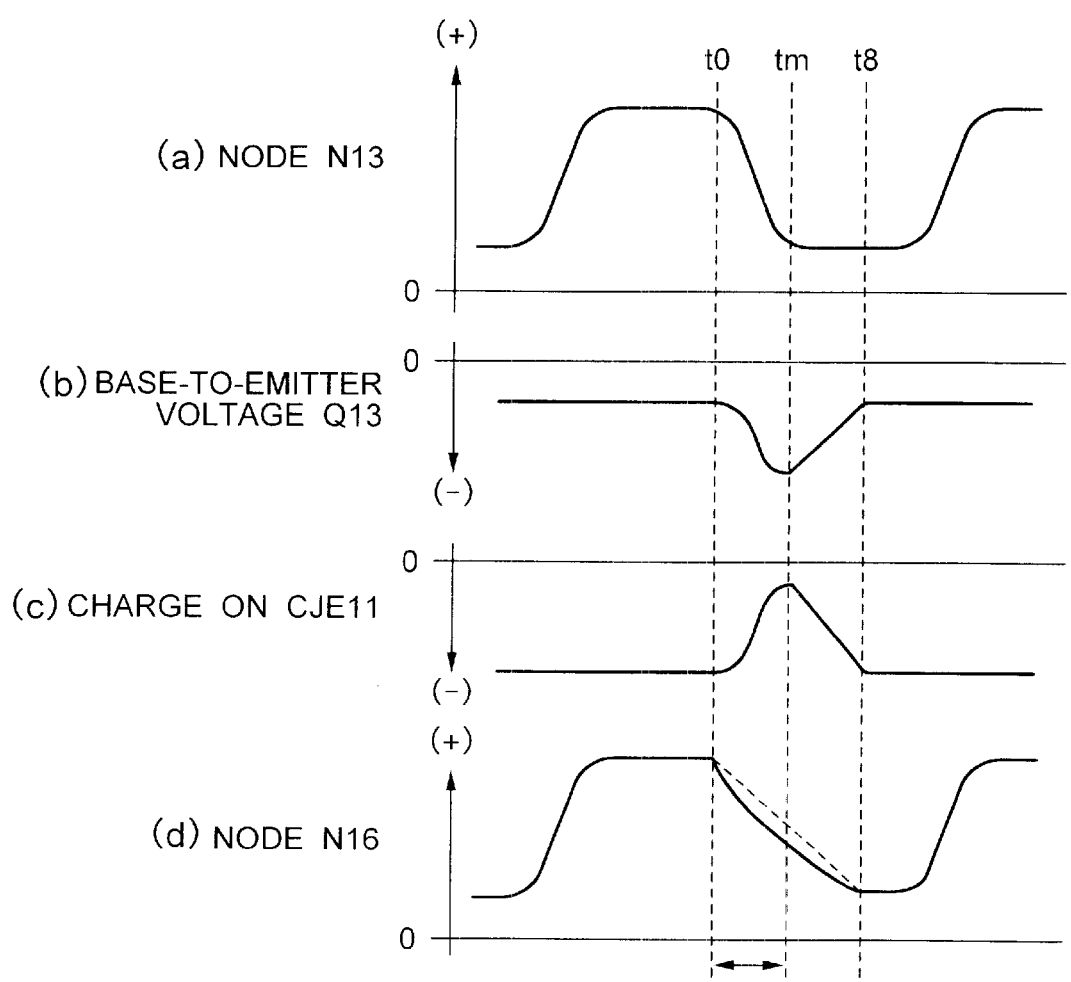
FIG. 4 is a timing chart for showing linearity deterioration in the ramp voltage caused by the parasitic capacitance in the variable delay circuit of FIG. 1.

Hereinafter, the variable delay circuit of the present invention will be described in conjunction with the embodiments of the present invention and with reference to the drawings, wherein similar constituent elements are designated by similar reference numerals throughout the drawings.

Figure 5:
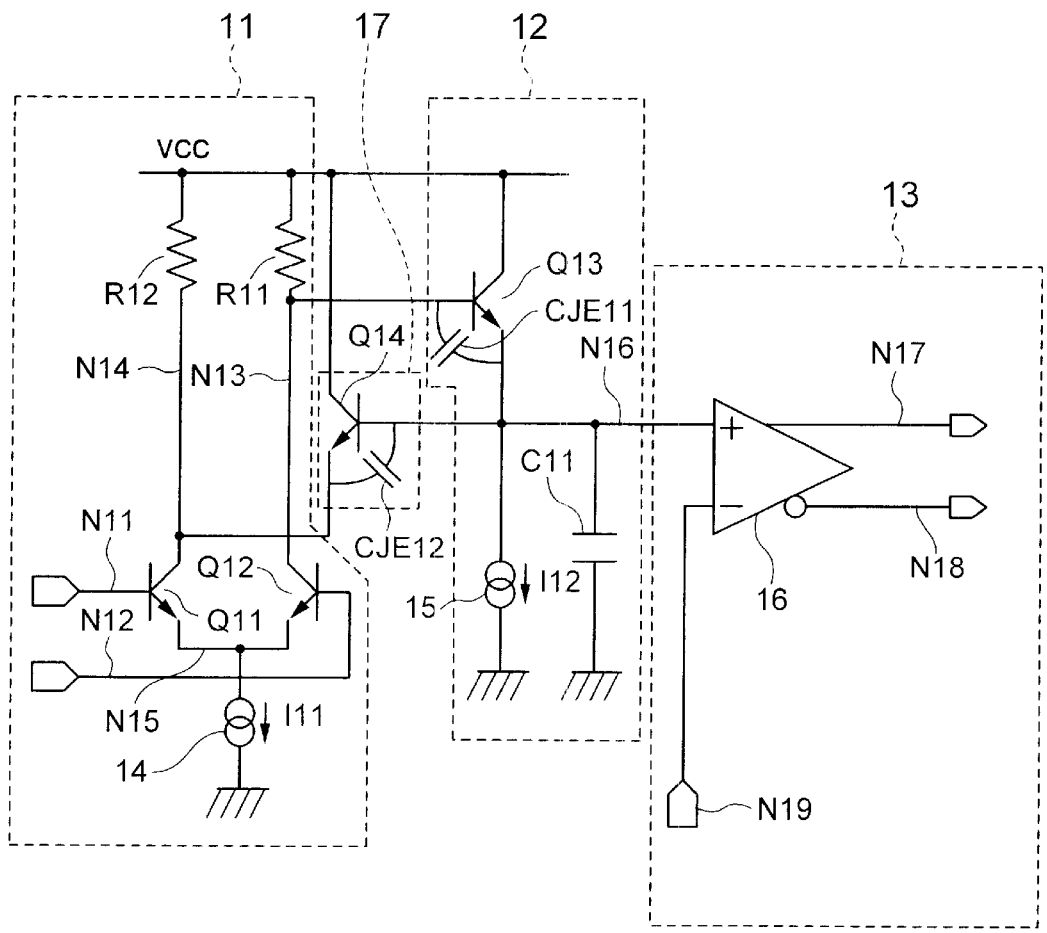
FIG. 5 is a circuit diagram showing a variable delay circuit according to a first embodiment of the present invention.

Referring to FIG. 5, there is shown a variable delay circuit according to a first embodiment of the present invention. The variable delay circuit of the present embodiment includes an amplifying buffer unit 11, a ramp voltage generating unit 12, a comparator unit 13, and a compensation unit 17. The amplifying buffer unit 11 is a differential circuit which is composed of an emitter-coupled-logic circuit including NPN transistors Q11 and Q12, a constant-current source 14, and resistors R11 and R12. The amplifying buffer unit 11 is used as an input circuit section. The ramp voltage generating unit 12 is composed of a capacitor-charging NPN transistor Q13, a constant-current source 15, and a storage capacitor C11. The comparator unit 13 is composed of a comparator 16 and a voltage setting input node N19. The compensation unit 17 is composed of an NPN transistor Q14 which is used for compensating the parasitic capacitor.

The base and collector of the NPN transistor Q11 are connected to nodes N11 and N14, respectively. The base and collector of the NPN transistor Q12 are connected to nodes N12 and N13, respectively. The NPN transistors Q11 and Q12 have respective emitters connected together at a node N15. The node N15 is connected to one of the terminals of the constant-current source 14 which is grounded at its other terminal. The node N14 is connected to one of the terminals of the resistor R12 which is connected to a power supply line VCC at the other terminal. The node N13 is connected to one of the terminals of the resistor R11 which is connected to the power supply line VCC at the other terminal.

The node N13 is connected to the base of the NPN transistor Q13 which operates as a capacitor charging transistor. The collector of the NPN transistor Q13 is connected to the power supply line VCC. The emitter of the same is connected to a ramp voltage generating node, or a node N16. This node N16 is connected to the inflow-side terminal of the capacitor discharging constant-current source 15 and either one terminal of the storage capacitor C11. The discharge terminal of the constant-current source 15 and the other terminal of the storage capacitor C11 are grounded.

The node N16, or the ramp voltage generating node, is connected to the non-inverting input of the comparator 16. The inverting input of the comparator 16 receives a voltage setting. The NPN transistor Q14 to be used as the compensating element is connected at its base to the node N16, the ramp voltage generating node. The emitter of the NPN transistor Q14 is connected to the node N14 from which the inverted logic of the node N13 is obtained. The collector of the same is connected to the power supply line VCC.

The NPN transistors Q13 and Q14 have the same structure and the same size, with parasitic capacitances Cje11 and Cje12 being involved between their bases and emitters, respectively. In general, parasitic capacitances have absolute variations from design values under the influence of process conditions, whereas they have very little relative variations within a single LSI and the LSIs formed under the same process conditions.

The resistors R12 and R11 have the same structure and the same size, and accordingly the same resistance. The node N19, or the inverting input of the comparator 16, is supplied with a voltage setting selected from a plurality of voltage settings. For example, the node N19 is connected to the output of a digital-to-analog converter (DAC) which is not shown in the drawing. A digital, arbitrary setting value is input to the DAC so that an analog voltage on the basis of the setting is input to the node N19 from the DAC. The output potential of the DAC shall vary linearly with sufficient accuracy to the digital input signal fed to the DAC.

The node N17 and/or N18 is connected to an external circuit. The nodes N11 and N12 receive differential signals which are complementary to each other. It is assumed here that the logic on the node N11 is the positive logic. The node N19 receives an arbitrary voltage that falls on any potential within the range of amplitude of the ramp wave generating node. Inputting H-level to the node N11 and L-level to the node N12 turns the NPN transistor Q11 ON and the NPN transistor Q12 OFF. Thus, the node N13 turns to H-level. Then, the NPN transistor Q13 turns ON to charge the storage capacitor C11, raising the potential of the node N16 to H-level. The storage capacitor C11 is charged steeply in a very short time after the potential change of the node N13.

Inputting L-level to the node N11 and H-level to the node N12 turns the NPN transistor Q11 OFF and the NPN transistor Q12 ON. Thus, the node N13 turns to L-level. The NPN transistor Q13 then turns OFF since the node N16 is held at the H-level by the charge stored in the storage capacitor C11. The charge stored in the storage capacitor C11 is gradually discharged at a constant rate through the constant-current source 15. Due to the constant rate of the discharge, the potential of the node N16 traces or follows a ramp voltage waveform which declines linearly in proportion to time. When this ramp voltage falls below the potential input to the node N19, the comparator 16 turns its output potential from H-level to L-level. The voltage setting input to the node N19 can be changed to modify the time instant at which the potential of the ramp voltage falls below the potential input to the node N19. This voltage setting achieves the variation of the delay time.

When L-level and H-level are input to the nodes N11 and N12, respectively, the NPN transistor Q13 is turned OFF so that the potential of the node 16 falls along a ramp voltage. The node N13 falls from H-level to L-level at an operating speed that is determined by the driveability of the amplifying buffer unit 11. The time instant at which the node N16 starts to generate a ramp voltage substantially coincides with the time instant at which the node N13 starts to fall. The time instant at which the node N13 stops fall, however, precedes the end time of the ramp voltage. As a result, the voltage across the base and emitter of the capacitor-charging transistor Q13 changes to thereby change the charge stored in the parasitic capacitance Cje11 involved between the nodes N13 and N16. This means that the charge flows out of the ramp voltage generating node N16 into the parasitic capacitance Cje11.

In the mean time, the potential of the node N14 rises from L-level to H-level. The signal change of the node N14 is opposite to that of the node N13 in terms of logical polarity, and identical thereto in terms of time instant. Thus, as in the case of the node N13, the ramp start time of the node N16 and the rise start time of the node N14 coincide with each other. The end times thereof are, however, different from each other, which means that the voltage across the emitter and base of the compensating transistor Q14 changes with time. The charge stored in the parasitic capacitance Cje12 also changes, the parasitic capacitance Cje12 being involved between the nodes N14 and N16, i.e., emitter and base of the transistor Q14 as in the case of transistor Q13. This means that the charge flows out of the parasitic capacitance Cje12 into the ramp voltage generating node N16.

Here, the charge that flows into the node 16 from the parasitic capacitance Cje12 and the charge that flows from the node 16 into the parasitic capacitance Cje11 are equal to each other in amount, thereby compensating each other to result in a total sum of zero. Since there occurs no change of the total electric charge other than that caused by the discharge through the constant-current source 15, the ramp voltage follows an ideal linear characteristic with respect to time.

Figure 6:
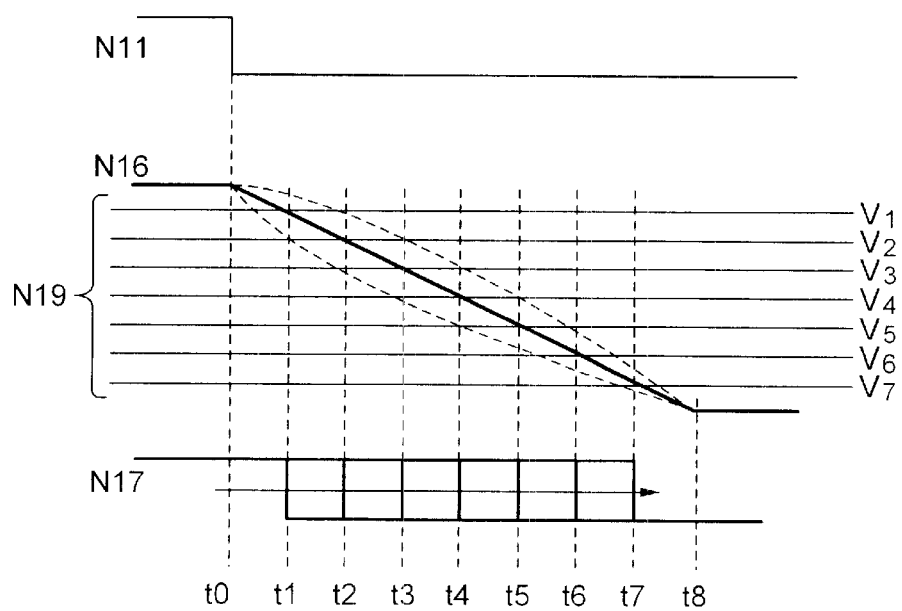
FIG. 6 is a timing chart of the potentials of nodes in the variable delay circuit of FIG. 5.

FIG. 6 shows the relationship between the potentials of nodes in the variable delay circuit of FIG. 5. For convenience of description, the delay time is shown as adjusted in seven levels. It is to be noted that the high-performance variable delay circuits shown in the present invention usually have a greater number of variation levels. At the time instant when the input signal fed to the node N11 falls from H-level to L-level, the potential of the node N16 starts to fall along a ramp voltage waveform that declines at a constant rate. When the ramp voltage becomes lower than (or equal to) the voltage setting input to the inverting input of the comparator 16, the output potential of the node N17, or an output of the comparator 16, falls from H-level to L-level. The output node N17 falls at one of the time instants t1 to t7, with the delay time thereof corresponding to one of the voltage settings V1 to V7.

The time interval between the time instant t0 at which the node N11 falls and any one of the time instants t1 to t7 at which the signals delayed in accordance with the voltage settings V1 to V7 are output is the total delay time generated by the variable delay circuit. The time interval between the time instant t1 and the time instant t7 is the span of the variable delay times.

Figure 7A:
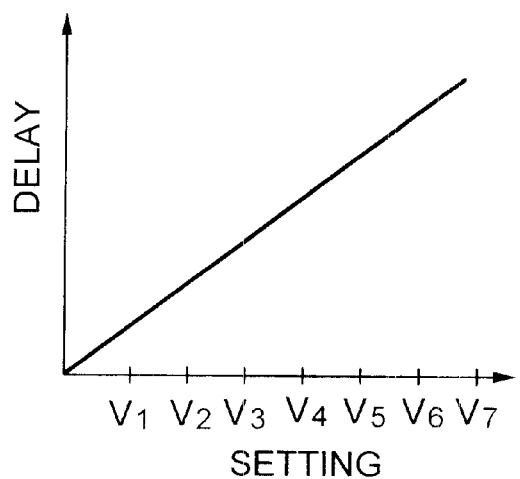
FIGS. 7A and 7B are diagrams showing the characteristics of the variable delay time and the non-linearity of the delay time, respectively, of the variable delay circuit of FIG. 5.
Figure 7B:
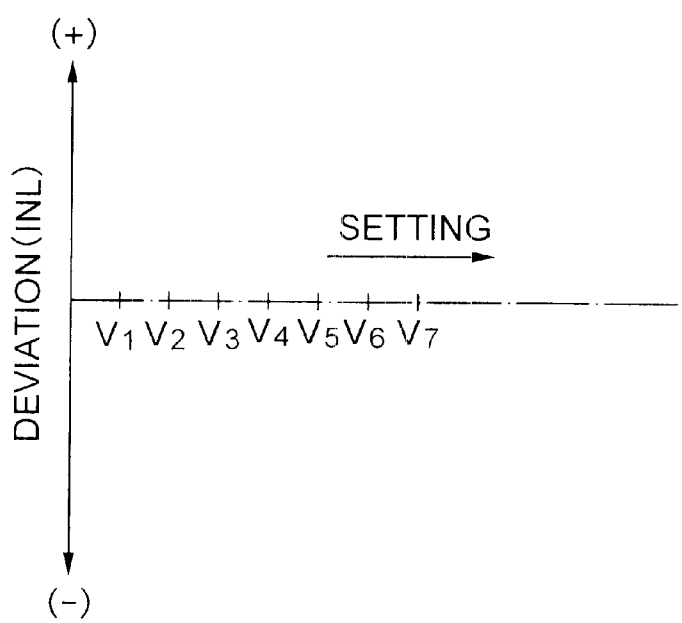

Referring to FIGS. 7A and 7B, there are shown a graph depicting the characteristic of the delay time with respect to the voltage setting in the variable delay circuit of FIG. 1, and a graph depicting the amount of deviation of the delay time from the straight line with respect to the voltage setting, respectively. The variable delay circuit of the present embodiment produces substantially no deterioration from the straight line due to the cancellation as described above.

Now the principle of the present invention will be described with reference to comparison with the conventional variable delay circuit of FIG. 1, wherein the compensating unit of the embodiment is not used. It is assumed here that the minimum resolution 1 LSB=10 ps, and the ramp voltage amplitude is 800 mV. Then, on the assumptions that the capacitor-charging transistor has a parasitic capacitance Cje11 of 5 fF, that the time for the output of the amplifying buffer unit 11, or for the signal input to the base of the capacitor-charging transistor Q13, to change from H-level to L-level is half the time for the ramp voltage to change from H-level to L-level, and that 1 ns elapses from the start to the end of the ramp voltage, then the ramp voltage falls 24.4 mV below the straight line. This translates into a decrease of 31 ps in the delay time. Since the minimum resolution 1 LSB is 10 ps, the value means that the integral non-linearity (INL) reaches as high as 3.1 LSB. The use of the variable delay circuit of the present embodiment substantially eliminates this non-linearity.

If a conventional variable delay circuit with a greater capacitor and a higher current for the constant-current source, as described before, is used so that the integrated non-linearity (INLΔ) assumes a value lower than or equal to the minimum resolution 1 LSB, or 10 ps, the storage capacitor C11 must be 3.1 times greater in size or more. Besides, the current must be 3.1 times higher or more. As described before, corresponding to the increased numbers of pins on LSIs to be measured and the advanced measurement coverage due to the higher integration and multi-function of LSIs in recent years, higher integration and lower power dissipation are also required of the tester LSIs. Under such circumstances, the above-mentioned increases in circuit scale and power dissipation are unacceptable.

Now, the conditions required for the linear characteristic of the ramp voltage will be described below in conjunction with general equations. In the following description, C stands for the capacitance of the storage capacitor C11, Q for the amount of charge stored in the storage capacitor C11, and V for the voltage across the storage capacitor C11, There holds a general equation (1):

$$V=Q/C \tag{1}$$

From the equation (1), it is found that the voltage V across the storage capacitor C11 is proportional to the amount of charge Q if the capacitance C is constant.

If the storage capacitor C11 is to be charged by a constantcurrent source, then Q, the amount of charge stored in the capacitor, is given by the equation (2):

$$Q=I\times t \tag{2}$$

where I is the current of the constant-current source 15, and t is the time elapsed from the start of charge, assuming that the amount of initial charge is zero. The case where an initial charge of Qm is discharged through the constant-current source of I, there holds the equation (3):

$$Q=(Qm-I\times t) \tag{3}$$

In the variable delay circuit, the amount of charge Qm stored in the storage capacitor C11 is discharged through the constant-current source of I. To show the relation as a time function, the voltage V is translated into a time-based equation V(t), or the equation (4) that is obtained from the equations (1)–(3):

$$V(t)=(Qm-I\times t)/C \tag{4}$$

As can be seen from the equation (4), the voltage V(t) across the storage capacitor C11 changes linearly in proportion to the time t if the current I is constant. It will be understood, however, that introduction of extraneous factors that change the charge stored in the storage capacitor C11 can impede V(t) from being proportional to the time t. The present invention solves the above problem by canceling the change of charge stored in the storage capacitor C11, as described before.

Figure 8:
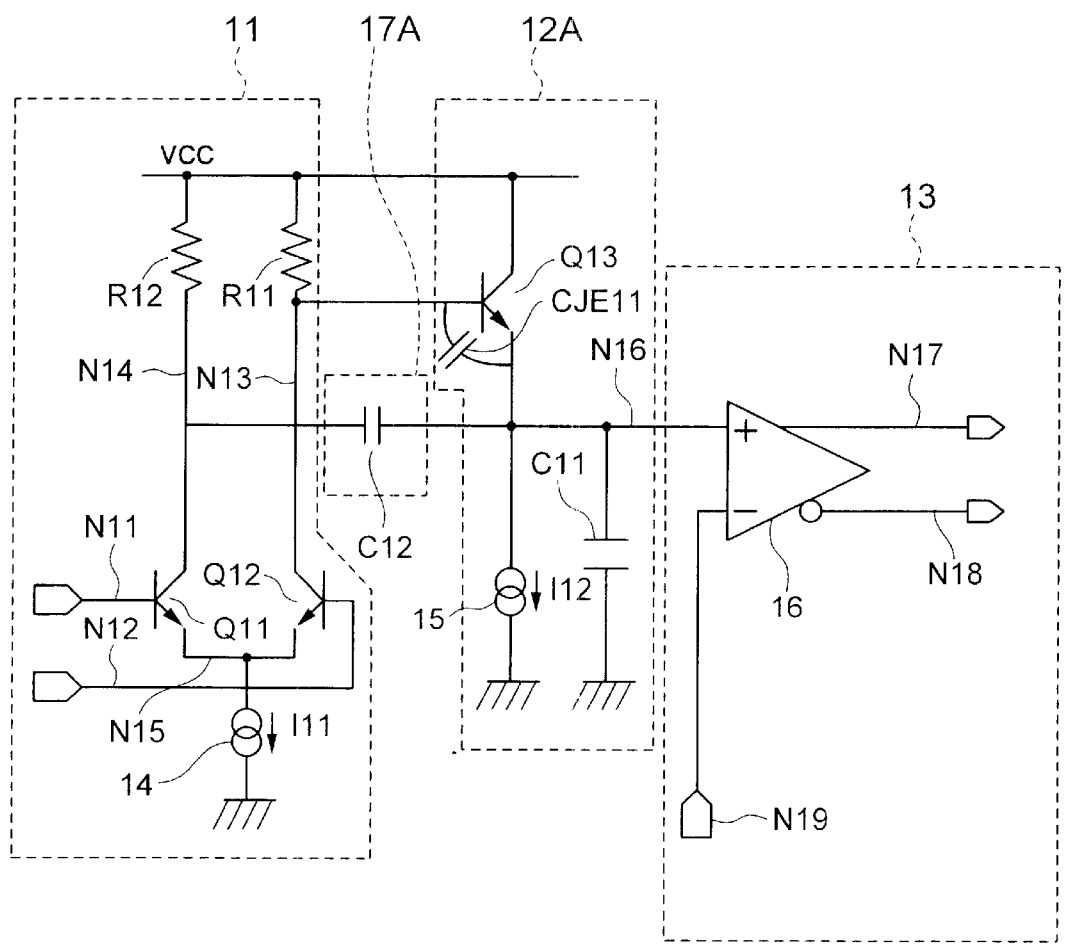
FIG. 8 is a circuit diagram showing a variable delay circuit according to a second embodiment.

Referring to FIG. 8, there is shown a variable delay circuit according to a second embodiment. The variable delay circuit of the present embodiment is similar to the first embodiment except that a compensating capacitor C12 is connected as the compensating unit 17A between the ramp voltage generating node N16 and the node N14, instead of the NPN transistor Q14 shown in FIG. 1. The capacitor C12 to be used for compensation has the same capacitance as the base-to-emitter parasitic capacitance Cje11 in the capacitor-charging transistor Q13. The operations and functions are identical to those of the first embodiment.

According to the present embodiment, wherein the capacitor C12 is used as the compensating element instead of the bipolar transistor, the circuit configuration can be simplified.

Figure 9:
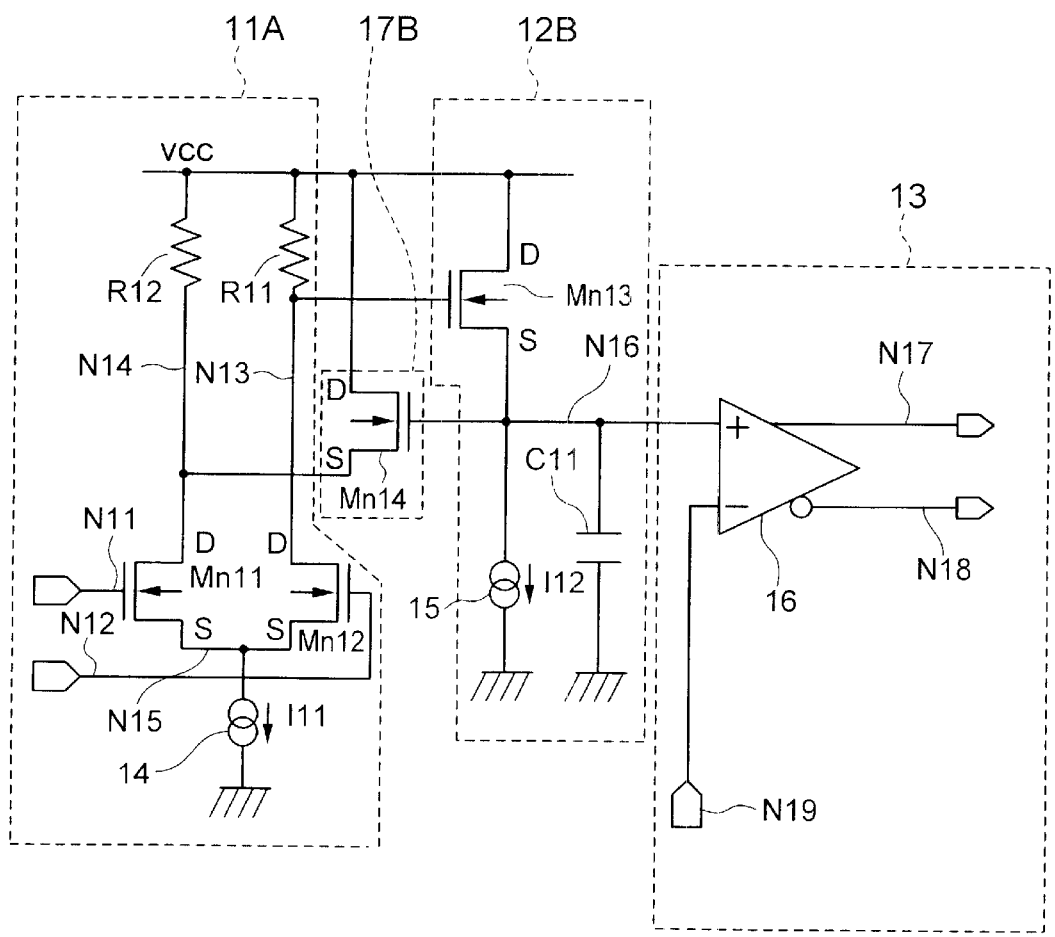
FIG. 9 is a circuit diagram showing a variable delay circuit according to a third embodiment.

Referring to FIG. 9, there is shown a variable delay circuit according to a third embodiment. The variable delay circuit of the present embodiment is similar to the first embodiment except that N-channel MOS (NMOS) transistors MN11 and MN12 are used in the amplifying buffer unit 11A, an NMOS transistor Mnl3 is used in the ramp voltage generating circuit 12B, and an NMOS transistor Mnl4 is used as a compensating unit 17B.

The variable delay circuit of the present embodiment has an advantage of lower power dissipation, due to the inherent characteristics of the MOS transistor. In the variable delay circuit of FIG. 5, the power supply voltage cannot be lowered due to the collector-to-emitter voltage of the bipolar transistor necessitating a higher power supply voltage. In contrast, the use of the MOS transistors allows a decrease of the drain-to-source voltage without a malfunction, thereby permitting a lower power supply voltage to be employed. Moreover, there is an advantage of easier fabrication as compared with the case where bipolar transistors are used.

Figure 10:
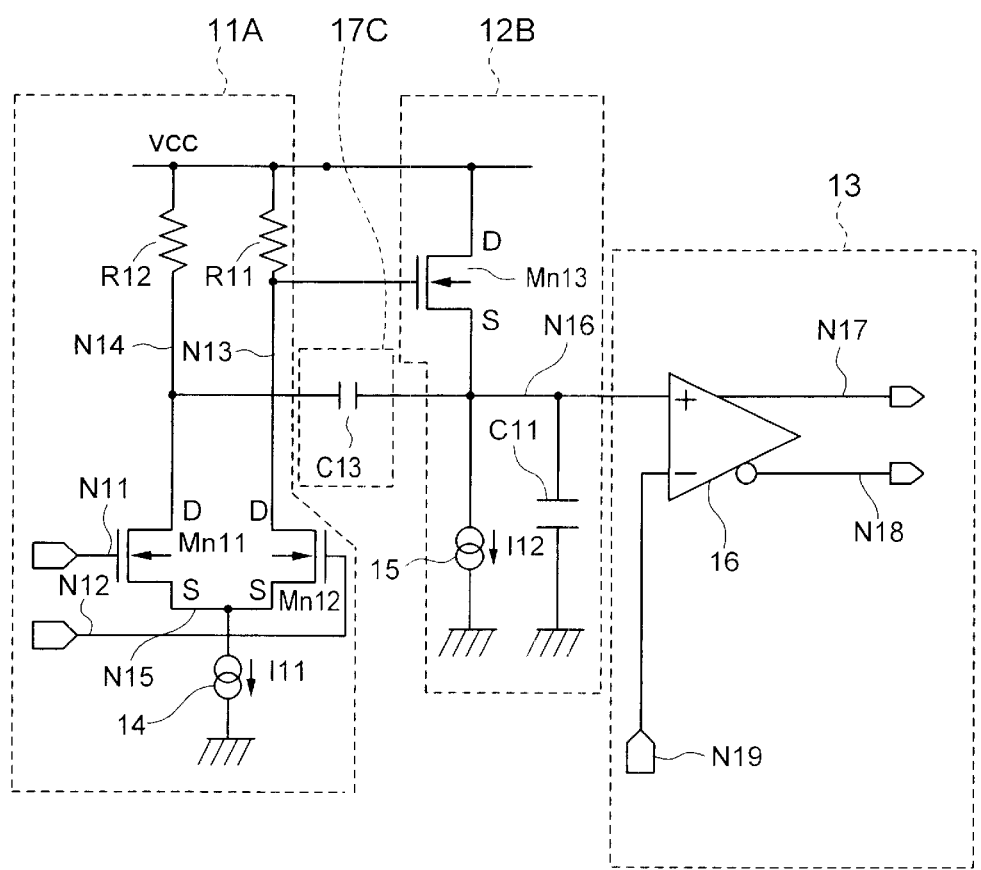
FIG. 10 is a circuit diagram showing a variable delay circuit according to a fourth embodiment.

In the circuit configuration of FIG. 10, the gate and drain of the NMOS transistor Mn11 are connected to nodes N11 and N14, respectively. The gate and drain of the NMOS transistor Mn12 are connected to the nodes N12 and N13, respectively. The NMOS transistors Mn11 and Mn12 both are connected to the node N15 at their respective sources. The node N15 is connected to the constant-current source 14 which is grounded at its other terminal. The node N14 is connected to one of the terminals of the resistor R12 which is connected to the power supply line VCC at the other terminal. The node N13 is connected to one of the terminals of the resistor R11 which is connected to the power supply line VCC at the other terminal.

The node N13 is connected to the gate of the NMOS transistor n13 which operates as a capacitor-charging transistor. The drain of the NMOS transistor Mn13 is connected to the power supply line VCC. The source of the same is connected to the ramp voltage generating node N16. The node N16 is connected through the constant-current source 15 to the ground and connected to one of the terminals of the storage capacitor C11, the other terminal of which is connected to the ground. The node N16, or the ramp voltage generating node, is connected to the non-inverting input of the comparator 16. The inverting input of the comparator 16 receives a voltage setting.

The NMOS transistor Mn14 used as the compensating element 17B is connected at its gate to the ramp voltage generating node N16. The source of the NMOS transistor Mn14 is connected to a compensation signal outputting terminal, or the node N14. The drain of the NMOS transistor Mn14 is connected to the power supply line VCC. Here, instead of the Mn14 to be used as the compensating element, a capacitor having the same capacitance as the gate-to-source parasitic capacitance of the capacitor-charging NMOS transistor Mn13 may be connected between the node N14 and the node N16. The variable delay circuit having such a capacitor constitutes a fourth embodiment of the present invention. FIG. 10 shows a circuit diagram thereof.

Figure 11:
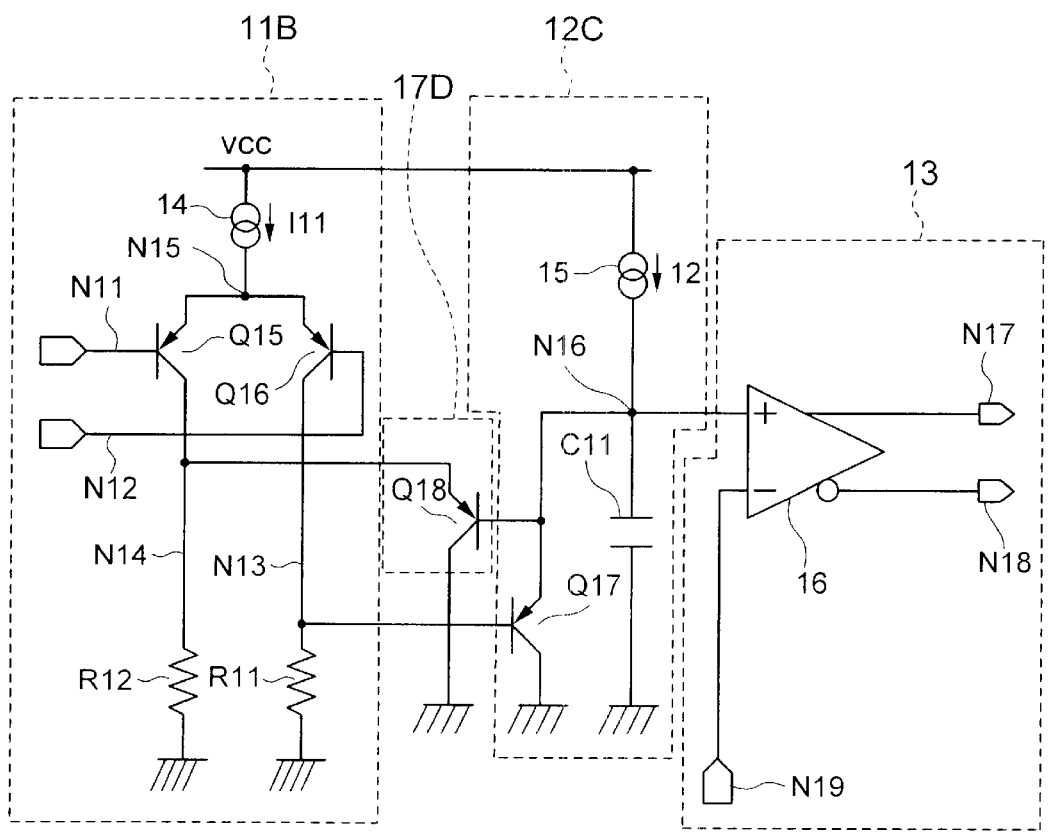
FIG. 11 is a circuit diagram showing a variable delay circuit according to a fifth embodiment.

Referring to FIG. 11, there is shown a variable delay circuit according to a fifth embodiment. The variable delay circuit of the present embodiment is similar to the first embodiment except that PNP transistors are used instead of the NPN transistors in the first embodiment. The delay time is generated at the time instant at which the ramp voltage rises from L-level to H-level.

In the circuit configuration of FIG. 11, the base and collector of the PNP transistor Q15 are connected to the nodes N11 and N14, respectively. The base and collector of the PNP transistor Q16 are connected to the nodes N12 and N13, respectively. The PNP transistors Q15 and Q16 both are connected to the node N15 at their respective emitters. The node N15 is connected to the constant-current source 14 which is connected to the power supply line VCC at its inflow-side terminal. The node N14 is connected to one of the terminals of the resistor R12 which is grounded at the other terminal. The node N13 is connected to one of the terminals of the resistor R11 which is grounded at the other terminal.

The node N13 is connected to the base of the PNP transistor Q18 which operates as a capacitor-discharging transistor. The collector of the PNP transistor Q18 is grounded. The emitter of the same is connected to the ramp voltage generating node, or node N16. This node N16 is connected to the outflow-side terminal of the constant-current source 15 for charging the storage capacitor C11 and either one terminal of the storage capacitor C11. The inflow-side terminal of the constant-current source 15 is connected to the power supply line VCC. The other terminal of the storage capacitor C11 is grounded. The node N16, or the ramp voltage generating node, is connected to the non-inverting input of the comparator 16. The inverting input of the comparator 16 receives a voltage setting.

Figure 12:
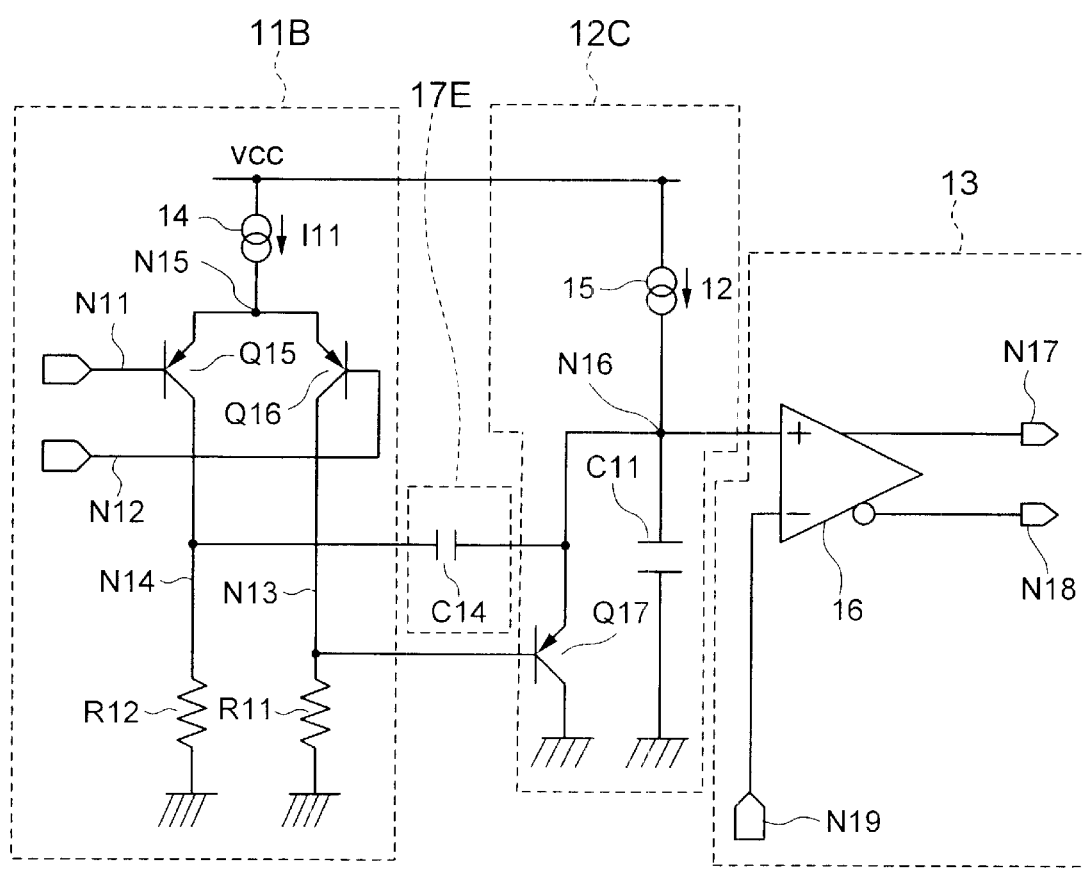
FIG. 12 is a circuit diagram showing a variable delay circuit according to a sixth embodiment.

The PNP transistor Q18 used as the compensating unit 17D is connected at its base to the ramp voltage generating node N16. The emitter of the PNP transistor Q18 is connected to the compensation signal outputting terminal, or the node N14. The collector of the PNP transistor Q18 is grounded. Here, instead of the PNP transistor Q18 used as the compensating unit 17B, a capacitor having the same capacitance as the base-to-emitter parasitic capacitance of the capacitor-discharging transistor Q17 may be connected between the node N14 and the node N16. The variable delay circuit having such a capacitor constitutes a sixth embodiment of the present invention. FIG. 12 shows a circuit diagram thereof.

Figure 13:
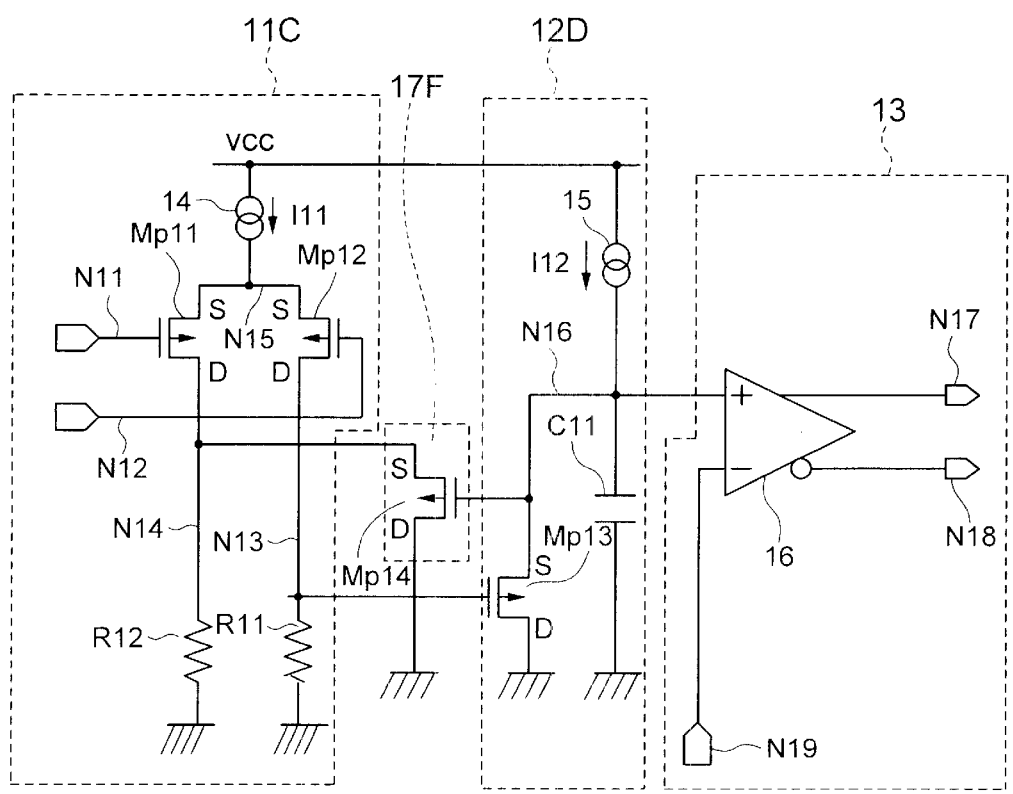
FIG. 13 is a circuit diagram showing a variable delay circuit according to a seventh embodiment.

Referring to FIG. 13, there is shown a variable delay circuit according to a seventh embodiment of the present invention. The variable delay circuit of the present embodiment is similar to the variable delay circuit of FIG. 11 except that PMOS transistors are used instead of the PNP bipolar transistors.

In the circuit configuration of FIG. 13, the gate and drain of the PMOS transistor Mp11 are connected to the nodes N11 and N14, respectively. The gate and drain of the PMOS transistor Mp12 are connected to the nodes N12 and N13, respectively. The PMOS transistors Mp11 and Mp12 both are connected to the node N15 at their respective sources. The node N15 is connected to the constant current source 14 which is connected to the power supply line VCC at its inflow-side terminal. The node N14 is connected to one of the terminals of the resistor R12 which is grounded at the other terminal. The node N13 is connected to one of the terminals of the resistor R11 which is grounded at the other terminal.

The node N13 is connected to the gate of the PMOS transistor Mp13 which operates as a capacitor-discharging transistor. The drain of the PMOS transistor Mp13 is grounded. The source of the same is connected to the ramp voltage generating node, or node N16. The node N16 is connected to the outflow-side terminal of the constant-current source 15 and either one terminal of the storage capacitor C11. The inflow-side terminal of the constant-current source 15 is connected to the power supply line VCC. The other terminal of the storage capacitor C11 is grounded. The node N16, or the ramp voltage generating node, is connected to the non-inverting input of the comparator 16. The inverting input of the comparator 16 receives a voltage setting.

Figure 14:
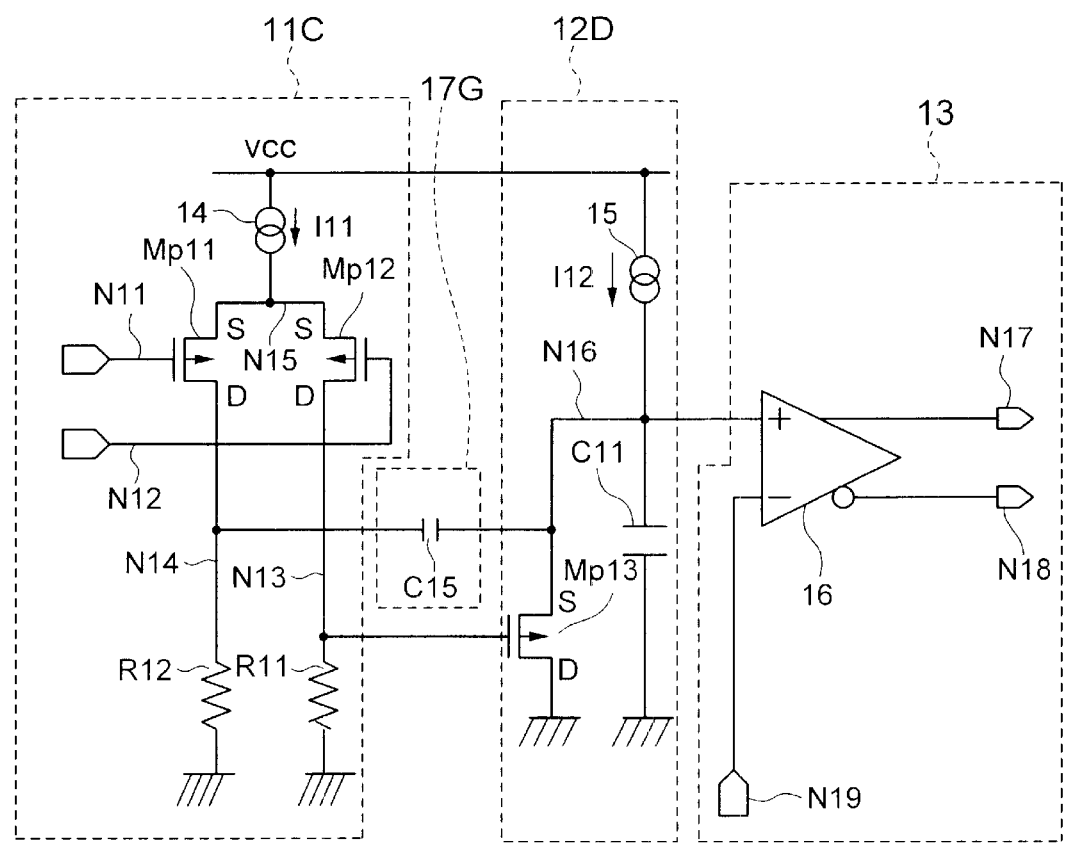
FIG. 14 is a circuit diagram showing a variable delay circuit according to an eighth embodiment.

The PMOS transistor Mp14 used as the compensating unit 17F is connected at its gate to the ramp voltage generating node N16. The source of the PMOS transistor Mp14 is connected to the compensation signal outputting terminal, or the node N14. The drain of the PMOS transistor Mp14 is grounded. Here, instead of the Mp14 used as the compensating unit 17F, a capacitor having the same capacitance as the gate-to-source parasitic capacitance of the capacitor-discharging transistor Mp13 may be connected between the node N14 and the node N16. The variable delay circuit having such a capacitor constitutes an eighth embodiment of the present invention. FIG. 14 shows a circuit diagram thereof.

As has been described, according to the variable delay circuits of the embodiments as described above, the compensation circuit compensates as much electric charge as that flowing out of or into the parasitic capacitance in the charging or discharging transistor. This maintains the high linearity of the ramp voltage, thereby offering the delay time with high linearity.

Since the above embodiments are described only for examples, the present invention is not limited to the above embodiments and various modifications or alterations can be easily made therefrom by those skilled in the art without departing from the scope of the present invention.

What is claimed is:

1. A variable delay circuit comprising a signal input unit for receiving an input signal to output a first signal through a first node, a ramp voltage generating unit for generating a ramp voltage on a ramp voltage output node, said ramp voltage generating unit including a storage capacitor for storing electric charge on said ramp voltage output node, a charging transistor for responding to said first signal to charge said ramp voltage output node, and a constant-current source for discharging said ramp voltage output node at a constant rate, a comparator for comparing said ramp voltage against a voltage setting to output a delayed signal which is delayed from said input signal by a delay time corresponding to said voltage setting, and a compensating unit for compensating electric charge flowing from said ramp voltage output node into a parasitic capacitance of said charging transistor.

2. The variable delay circuit as defined in claim 1, wherein said signal input unit is a differential circuit having a pair of complementary output nodes including said first node and a second node, and said compensating unit is a compensating capacitor connected between said ramp voltage output node and said second node.

3. The variable delay circuit as defined in claim 2, wherein said charging transistor is an NPN transistor and said compensating capacitor is implemented by a p-n junction reverse-biased between said ramp voltage output node and said second node.

4. The variable delay circuit as defined in claim 3, wherein said p-n junction is implemented by base and emitter of another NPN transistor having a design size equal to that of said charging transistor.

5. The variable delay circuit as defined in claim 2, wherein said charging transistor is an NMOS transistor.

6. The variable delay circuit as defined in claim 5, wherein said compensating capacitor is implemented by an NMOS capacitor.

7. A variable delay circuit comprising a signal input unit for receiving an input signal to output a first signal through a first node, a ramp voltage generating unit for generating a ramp voltage on a ramp voltage output node, said ramp voltage generating unit including a storage capacitor for storing electric charge on said ramp voltage output node, a discharging transistor for responding to said first signal to discharge said ramp voltage output node, and a constant-current source for charging said ramp voltage output node at a constant rate, a comparator for comparing said ramp voltage against a voltage setting to output a delayed signal which is delayed from said input signal by a delay time corresponding to said voltage setting, and a compensating unit for compensating electric charge flowing from said ramp voltage output node into a parasitic capacitance of said discharging transistor.

8. The variable delay circuit as defined in claim 7, wherein said signal input unit is a differential circuit having a pair of complementary output nodes including said first node and a second node, and said compensating unit is a compensating capacitor connected between said ramp voltage output node and said second node.

9. The variable delay circuit as defined in claim 8, wherein said discharging transistor is a PNP transistor and said compensating capacitor is implemented by a p-n junction reverse-biased between said ramp voltage output node and said second node.

10. The variable delay circuit as defined in claim 9, wherein said p-n junction is implemented by base and emitter of another PNP transistor having a design size equal to that of said charging transistor.

11. The variable delay circuit as defined in claim 8, wherein said discharging transistor is a PMOS transistor.

12. The variable delay circuit as defined in claim 11, wherein said compensating capacitor is implemented by a PMOS capacitor.

13. The variable delay circuit as defined in claim 1, wherein said signal input unit comprises a differential circuit having a pair of complementary output nodes including said first node and a second node.

14. The variable delay circuit as defined in claim 13, wherein said compensating unit comprises a compensating capacitor connected between said ramp voltage output node and said second node.

15. The variable delay circuit as defined in claim 7, wherein said signal input unit comprises a differential circuit having a pair of complementary output nodes including said first node and a second node.

16. The variable dely circuit as defined in claim 15, wherein said compensating unit comprises a compensating capacitor connected between said ramp voltage output node and said second node.

* * * * *